United States Patent
Takahashi et al.

(10) Patent No.: US 10,622,205 B2
(45) Date of Patent: Apr. 14, 2020

(54) SUBSTRATE PROCESSING METHOD AND SUBSTRATE PROCESSING APPARATUS

(71) Applicant: TOKYO ELECTRON LIMITED, Tokyo (JP)

(72) Inventors: Hiroyuki Takahashi, Yamanashi (JP); Tomoaki Ogiwara, Yamanashi (JP); Takuya Abe, Yamanashi (JP); Masahiko Tomita, Yamanashi (JP); Jiro Katsuki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/044,918

(22) Filed: Feb. 16, 2016

(65) Prior Publication Data

US 2016/0236244 A1   Aug. 18, 2016

(30) Foreign Application Priority Data

Feb. 16, 2015  (JP) .................. 2015-027461
Oct. 29, 2015  (JP) .................. 2015-212930

(51) Int. Cl.
*H01L 21/02* (2006.01)
*H01L 21/311* (2006.01)

(52) U.S. Cl.
CPC .... *H01L 21/0206* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 2006/0216941 A1* | 9/2006 | Hasebe | H01L 21/31116 438/715 |
| 2009/0242129 A1* | 10/2009 | Onishi | H01L 21/31116 156/345.37 |
| 2011/0035957 A1 | 2/2011 | Muraki et al. | |
| 2012/0156887 A1 | 6/2012 | Ono et al. | |
| 2013/0130499 A1* | 5/2013 | Ugajin | H01L 21/31116 438/689 |

FOREIGN PATENT DOCUMENTS

| | | |
|---|---|---|
| JP | 2007-266455 | 10/2007 |
| JP | 2008-160000 | 7/2008 |
| JP | 2014-528181 A | 10/2014 |
| KR | 10-2008-0084742 A | 9/2008 |
| KR | 10-2013-0135233 A | 12/2013 |
| WO | WO 2011/024777 A1 | 3/2011 |
| WO | WO 2012/018010 A1 | 2/2012 |

* cited by examiner

*Primary Examiner* — Mikhail Kornakov
*Assistant Examiner* — Pradhuman Parihar
(74) *Attorney, Agent, or Firm* — Fenwick & West LLP

(57) ABSTRACT

There is provided a substrate processing method for removing an oxide film formed on a surface of a substrate. The method includes (a) transforming the oxide film into a reaction by-product by supplying a halogen element-containing gas and a basic gas to the substrate accommodated in a processing chamber; and (b) sublimating the reaction by-product to remove the reaction by-product from the substrate by stopping the supply of the halogen element-containing gas into the processing chamber and supplying an inert gas into the processing chamber. The steps (a) and (b) are repeated a plurality of times.

7 Claims, 8 Drawing Sheets

SUBSTRATE PROCESSING METHOD AND SUBSTRATE PROCESSING APPARATUS

CROSS-REFERENCE TO RELATED APPLICATIONS

This application claims priority to Japanese Patent Application No. 2015-212930 filed on Oct. 29, 2015 and Japanese Patent Application No. 2015-027461 filed on Feb. 16, 2015, the entire contents of which are incorporated herein by reference.

FIELD OF THE INVENTION

The disclosure relates to a substrate processing method and a substrate processing apparatus, and more particularly, to a substrate processing method and apparatus for removing an oxide film.

BACKGROUND OF THE INVENTION

In a semiconductor device manufacturing method using a silicon wafer (hereinafter, referred to as "wafer"), a film forming process of forming a conductive film and an insulating film on a surface of a wafer, a lithography process of forming a photoresist layer of a predetermined pattern on the conductive film and the insulating film, an etching process of forming a wiring groove or a contact hole in the insulating film or forming a conductive film as a gate electrode by a plasma generated from a processing gas by using the photoresist layer as a mask, and the like are repeatedly performed.

For example, in a certain electronic device manufacturing method, a groove is formed in a predetermined pattern in a polysilicon film formed on a surface of a wafer and, then, a $SiO_2$ layer is formed to fill the groove. Next, the $SiO_2$ layer is removed by etching or the like until a predetermined thickness thereof is obtained.

As a method for removing the $SiO_2$ layer, there is known a substrate processing method for performing a COR (Chemical Oxide Removal) process and a PHT (Post Heat Treatment) process on the wafer. In the COR process, a by-product is generated by chemical reaction between the $SiO_2$ layer and gas molecules. In the PHT process, the by-product generated on the wafer by the chemical reaction of the COR process is removed from the wafer by evaporation or sublimation by heating the wafer that has been subjected to the COR process.

As a substrate processing apparatus for performing the substrate processing method including the COR process and the PHT process, there is known a substrate processing apparatus including a chemical reaction processing chamber (COR processing chamber) and a heat treatment chamber (PHT processing chamber) connected to the chemical reaction processing chamber (see, Japanese Patent Application Publication No. 2008-160000). In addition, there is known a substrate processing apparatus for performing, in the same processing chamber, a COR process on a wafer at a low temperature and then a PHT process at a temperature increased to a predetermined level by heating the wafer (see Japanese Patent Application Publication No. 2007-266455).

However, in the substrate processing apparatus in which the chemical reaction processing chamber and the heat treatment chamber are separately provided, the number of the processing chambers is increased and, also, a transfer unit for transferring the wafer between the chemical reaction processing chamber and the heat treatment chamber is required. Due to the installation space of the transfer unit, the entire substrate processing apparatus is scaled up. Further, a wafer transfer time is increased, so that a productivity is decreased. Meanwhile, even in the substrate processing apparatus for performing the chemical process and the heat treatment in the same processing chamber, time for changing the temperature of the wafer is required, so that it is difficult to improve the productivity.

SUMMARY OF THE INVENTION

In view of the above, the disclosure provides a substrate processing method and apparatus capable of improving a productivity by increasing a throughput of an oxide film removal process.

In accordance with a first aspect of the present invention, there is provided a substrate processing method for removing an oxide film formed on a surface of a substrate, including: (a) transforming the oxide film into a reaction by-product by supplying a halogen element-containing gas and a basic gas to the substrate accommodated in a processing chamber; and (b) sublimating the reaction by-product to remove the reaction by-product from the substrate by stopping the supply of the halogen element-containing gas into the processing chamber and supplying an inert gas into the processing chamber, wherein the steps (a) and (b) are repeated a plurality of times.

In accordance with a second aspect of the present invention, there is provided a substrate processing apparatus including: a mounting stage to mount thereon a substrate; a chamber to accommodate therein the mounting stage; a temperature control unit configured to control a temperature of the substrate mounted on the mounting stage; a gas supply unit configured to selectively supply a halogen element-containing gas, a basic gas and an inert gas into the chamber; a gas exhaust unit configured to exhaust the chamber; and a control unit configured to control operations of the temperature control unit, the gas supply unit and the gas exhaust unit, wherein the control unit is configured to repeatedly perform a plurality of times a step (a) of transforming the oxide film into a reaction by-product by supplying the halogen element-containing gas and a basic gas to the substrate while maintaining a temperature of the substrate mounted on the mounting stage at a predetermined level and maintaining the chamber at a depressurized atmosphere lower than an atmospheric pressure, and a step (b) of sublimating the reaction by-product to remove the reaction by-product from the substrate by stopping the supply of the halogen element-containing gas into the processing chamber and supplying an inert gas into the processing chamber while maintaining the chamber at a depressurized atmosphere lower than the depressurized atmosphere set in the step (a).

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, embodiments will be described in detail with reference to the accompanying drawings which form a part hereof.

Figure 1:
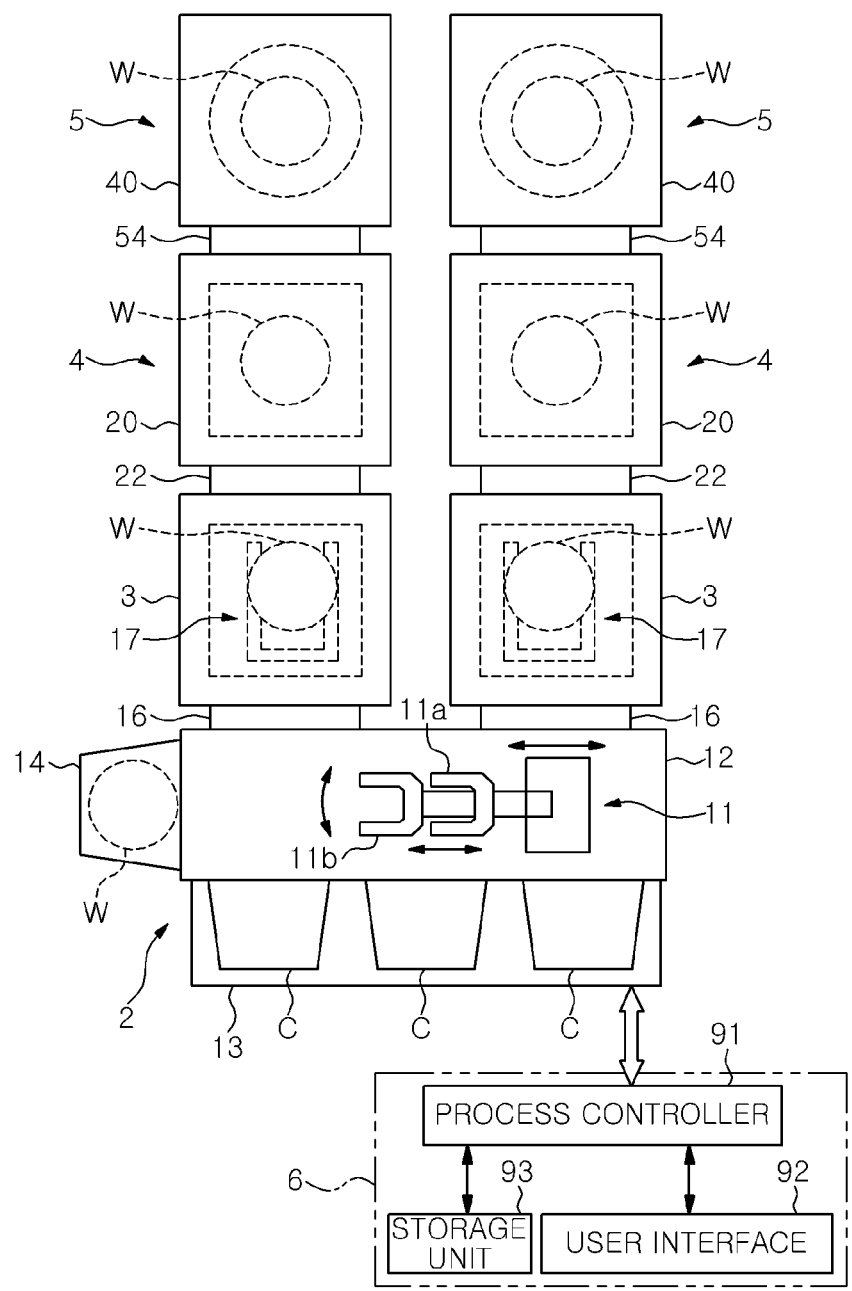
FIG. 1 is a top view showing a schematic configuration of a substrate processing system including a substrate processing apparatus according to an embodiment.

FIG. 1 is a top view showing a schematic configuration of a substrate processing system 1 including a substrate processing apparatus according to an embodiment.

A substrate processing system 1 includes: a loader module 2 through which a semiconductor wafer W (hereinafter, simply referred to as "wafer W") as a target substrate is loaded and unloaded; two load-lock chambers 3 provided adjacent to the loader module 2; heat treatment apparatuses 4 respectively provided adjacent to the load-lock chambers 3, for performing heat treatment on the wafer W; etching apparatuses 5 respectively provided adjacent to the heat treatment apparatuses 4, for performing an oxide film removal process (a COR (Chemical Oxide Removal) process and a PHT (Post Heat Treatment) process which will be described later) as an example of an etching process for the wafer W; and a control unit 6.

The loader module 2 includes a transfer chamber 12 in which a first wafer transfer unit 11 for transferring the wafer W is provided. The first wafer transfer unit 11 has two transfer arms 11a and 11b for holding the wafer W in a substantially horizontal direction. A mounting stage 13 is provided at a longitudinal side of the transfer chamber 12. A plurality of (e.g., three) carriers C, each capable of accommodating therein a plurality of wafers W, can be mounted and connected to the mounting stage 13. Installed adjacent to the transfer chamber 12 is an orienter 14 for performing position alignment of the wafer W by optically obtaining an eccentric amount while rotating the wafer W.

In the loader module 2, the wafer W held on the transfer arms 11a and 11b is vertically moved and linearly moved in a substantially horizontal plane by the driving of the first wafer transfer unit 11 and transferred to a desired position. The transfer arms 11a and 11b are configured to load and unload the wafer by moving back and forth with respect to the carriers C on the mounting stage 13, the orienter 14, and the load-lock chambers 3.

The load-lock chambers 3 are connected to the transfer chamber 12 via gate valves 16. In each of the load-lock chambers, a second wafer transfer unit 17 for transferring a wafer W is provided. Each of the load-lock chambers 3 can be evacuated to a predetermined vacuum level.

The second wafer transfer unit 17 has a multi-joint arm structure. Further, the second wafer transfer unit 17 has a pick for holding the wafer W in a substantially horizontal direction. In the second wafer transfer unit 17, when the multi-joint arm is not stretched, the pick is positioned inside the load-lock chamber 3. When the multi-joint arm is stretched, the pick reaches the heat treatment apparatus 4. When the multi-joint arm is further stretched, the pick reaches the etching apparatus 5. In this manner, the second wafer transfer unit 17 can transfer the wafer W between the load-lock chamber 3, the heat treatment apparatus 4 and the etching apparatus 5.

The heat treatment apparatus 4 includes an evacuable chamber 20. The chamber 20 has therein a mounting stage (not shown) for mounting thereon the wafer W. A heater (not shown) is installed in the mounting stage. In the heat treatment chamber 4, the wafer W that has been subjected to the oxide film removal process is mounted on the mounting stage and heated by the heater to evaporate and remove a residue on the wafer W.

A loading/unloading port through which the wafer is transferred to and from the load-lock chamber 3 is provided at a portion of the chamber 20 which faces the load-lock chamber 3. The loading/unloading port can be opened and closed by a gate valve 22. In addition, a loading/unloading port through which the wafer is transferred to and from the etching apparatus 5 is provided at a portion of the chamber which faces the etching apparatus 5. The loading/unloading port can be opened and closed by a gate valve 54.

A gas supply line (not shown) is connected to an upper portion of a sidewall of the chamber 20 and also connected to a gas supply unit (not shown). A gas exhaust line (not shown) is connected to a bottom wall of the chamber 20 and also connected to a vacuum pump (not shown). A flow rate control valve is installed in the gas supply line extended from the gas supply unit to the chamber 20. A pressure control valve is installed in the gas exhaust line. By controlling these valves, the heat treatment can be performed in a state where a pressure in the chamber 20 is maintained at a predetermined level.

Figure 2:
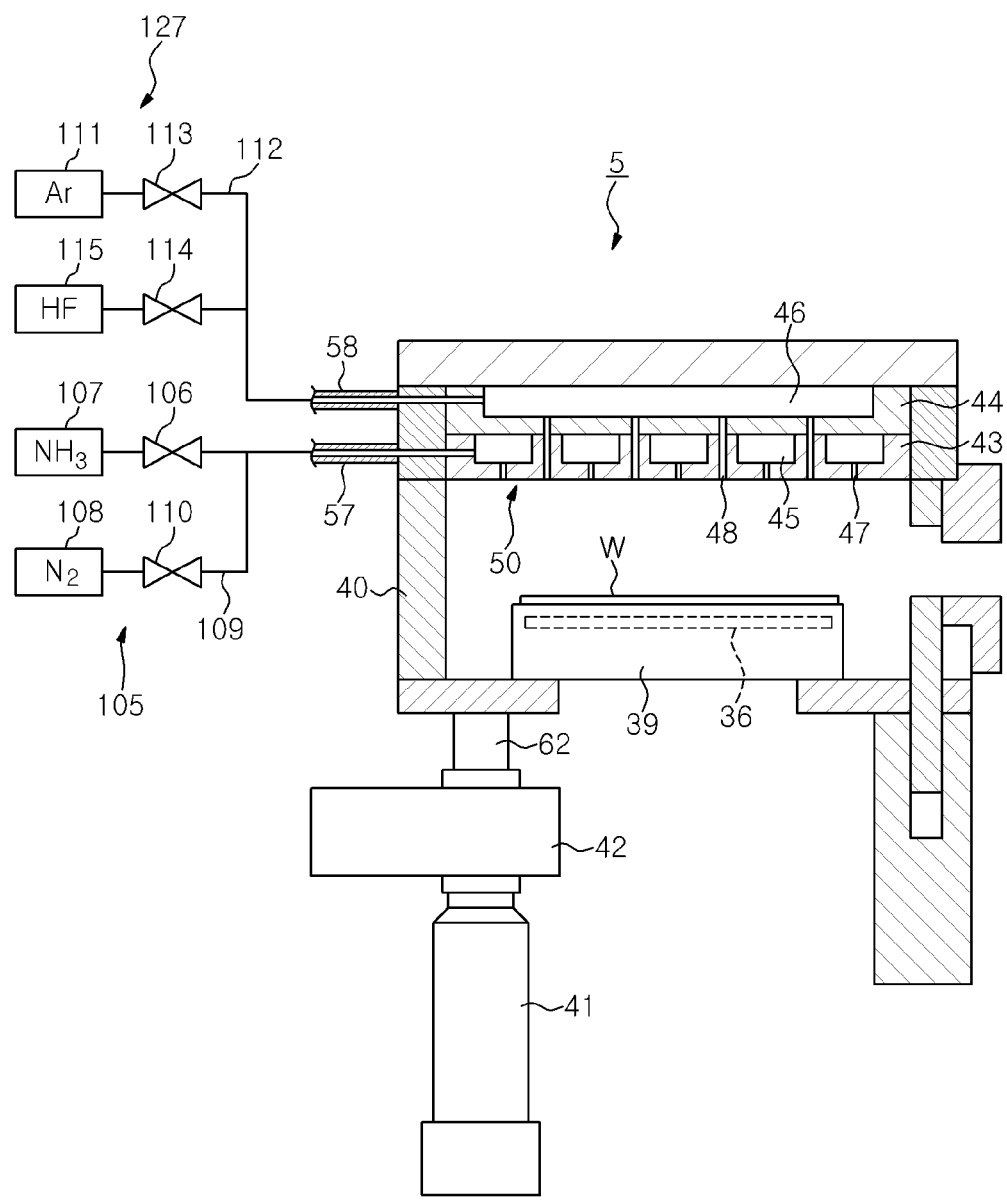
FIG. 2 is a cross sectional view showing a schematic configuration of an etching apparatus of the substrate processing system shown in FIG. 1.

FIG. 2 is a cross sectional view showing a schematic configuration of the etching apparatus 5. The etching apparatus 5 includes a cylindrical processing chamber 40, a mounting stage 39 provided in the chamber 40 and configured to mount thereon a wafer W, and a shower head 50 provided at the upper side of the chamber 40 to face the mounting stage 39. The etching apparatus 5 further includes a TMP (Turbo Molecular Pump) 41 serving as a gas exhaust unit for discharging a gas in the chamber 40, and an APC (Adaptive Pressure Control) valve 42 disposed between the TMP 41 and a gas exhaust duct 62 installed in the chamber 40 and serving as a variable valve for controlling a pressure in the chamber 40.

The shower head 50 has a two-layer structure including a lower portion 43 and an upper portion 44. A first buffer space 45 is provided at the lower portion 43. A second buffer space 46 is provided at the upper portion 44. The first buffer space 45 and the second buffer space 46 communicate with the chamber 40 via gas ventholes 47 and 48, respectively. In other words, the shower head 50 includes two laminated plate-shaped members (the lower portion 43 and the upper portion 44) each of which has an internal path for guiding a gas supplied to the first buffer space 45 or the second buffer space 46 into the chamber 40.

The chamber 40 is connected to a gas supply unit including an ammonia ($NH_3$) gas supply system 105 and a hydrogen fluoride (HF) gas supply system 127. The lower portion 43 of the shower head 50 is connected to the ammonia gas supply system 105. The ammonia gas supply system 105 has an ammonia gas supply line 57 communicating with the first buffer space 45 of the lower portion 43, an ammonia gas valve 106 installed in the ammonia gas supply line 57, and an ammonia gas supply unit 107 connected to the ammonia gas supply line 57. The ammonia gas supply unit 107 supplies an ammonia gas at a controlled flow rate to the first buffer space 45 through the ammonia gas supply line 57. The ammonia gas valve 106 can control communication and shut-off of the ammonia gas supply line 57.

The ammonia gas supply system 105 includes a nitrogen ($N_2$) gas supply unit 108, a nitrogen gas supply line 109 connected to the nitrogen gas supply unit 108, and a nitrogen gas valve 110 installed in the nitrogen gas supply line 109. The nitrogen gas supply line 109 is connected to the ammonia gas supply line 57 between the first buffer space 45 and the ammonia gas valve 106. The nitrogen gas supply unit 108 supplies nitrogen gas to the first buffer space 45 through the nitrogen gas supply line 109 and the ammonia gas supply line 57. The nitrogen gas supply unit 108 controls a flow rate of the supplied nitrogen gas. The nitrogen gas valve 110 can control communication and shut-off of the nitrogen gas supply line 109.

By switching on/off of the ammonia gas valve 106 and the nitrogen gas valve 110, types of gases supplied into the first buffer space 45 and further into the chamber 40 can be selectively changed.

The upper portion 44 of the shower head 50 is connected to the hydrogen fluoride gas supply system 127. The hydrogen fluoride gas supply system 127 includes a hydrogen fluoride gas supply line 58 communicating with the second buffer space 46 of the upper portion 44, a hydrogen fluoride gas valve 114 installed in the hydrogen fluoride gas supply line 58, and a hydrogen fluoride gas supply unit 115 connected to the hydrogen gas supply line 58. The hydrogen fluoride gas supply unit 115 supplies a hydrogen fluoride gas into the second buffer space 46 through the hydrogen fluoride gas supply line 58. The hydrogen fluoride gas supply unit 115 controls a flow rate of the supplied hydrogen fluoride gas. The hydrogen fluoride gas valve can control communication and shut-off of the hydrogen fluoride gas supply line 58. A heater (not shown) is installed in the upper portion 44 of the shower head 50. The heater can heat the hydrogen fluoride gas in the second buffer space 46.

The hydrogen fluoride gas supply system 127 includes an argon (Ar) gas supply unit 111, an argon gas supply line 112 connected to the argon gas supply unit 111, and an argon gas valve 113 installed in the argon gas supply line 112. The argon gas supply line 112 is connected to the hydrogen fluoride gas supply line 58 between the second buffer space 46 and the hydrogen fluoride gas valve 114. The argon gas supply unit 111 supplies argon gas into the second buffer space 46 through the argon gas supply line 112 and the hydrogen fluoride gas supply line 58. The argon gas supply unit 111 controls a flow rate of the supplied argon gas. The argon gas valve 113 can control communication and shut-off of the argon gas supply line 112.

A volumetric flow rate ratio of the ammonia gas and the hydrogen fluoride gas supplied from the shower head 50 into the chamber 40 is controlled by the cooperation of the ammonia gas supply unit 107 of the ammonia gas supply system 105 and the hydrogen fluoride gas supply unit 115 of the hydrogen fluoride supply system 127.

The etching apparatus 5 is designed such that an ammonia gas and a hydrogen fluoride gas are mixed for the first time in the chamber 40 (post-mix type) to prevent the ammonia gas and the hydrogen fluoride gas from being mixed and reacting with each other before they are introduced into the chamber 40. Further, the etching apparatus 5 has a heater (not shown) installed in the sidewall of the chamber 40. Therefore, a temperature decrease in an atmosphere of the chamber 40 can be prevented and, further, the reproducibility of the oxide film removal process can be improved. In addition, by controlling a temperature of the sidewall, it is possible to suppress adhesion of a reaction by-product and a residual product generated in the chamber 40 during the oxide film removal process to the inner side of the sidewall.

The mounting stage 39 has a substantially circular shape when seen from the top and is fixed to the bottom portion of the chamber 40. The mounting stage 39 has therein a temperature controller 36 for controlling a temperature of the mounting stage 39. The temperature controller 36 has a pipeline through which a temperature control medium, e.g., water or the like, circulates. Due to the heat exchange with the temperature control medium flowing through the pipeline, the temperature of the mounting stage 39 is controlled and, further, the temperature of the wafer W on the mounting stage 39 is controlled.

The mounting stage 39 has lift pins (not shown) for moving up and down the wafer W with respect to the top surface of the mounting stage 39 to transfer the wafer W to and from the second wafer transfer unit 17. The oxide film removal process performed by the etching apparatus 5 will be described in detail later with reference to FIGS. 3A to 5B.

Referring back to FIG. 1, the control unit 6 includes a process controller 91 having a microprocessor (computer) for controlling the respective components of the substrate processing system 1. The process controller 91 is connected to a user interface 92 including a keyboard through which an operator inputs a command to manage the substrate processing system 1, a display for visually displaying a state of the substrate processing system 1, and the like. The process controller 91 is also connected to a storage unit 93 that stores therein control programs for executing various processes performed in the substrate processing system 1, e.g., supply of a processing gas used for the oxide film removal process performed by the etching apparatus 5, exhaust of the chamber 40 and the like, under the control of the process controller 91, processing recipes that are control programs for executing predetermined processes of the respective components of the substrate processing system 1 in accordance with processing conditions, various database and the like. The processing recipes and the like are stored in a storage medium (not shown) of the storage unit 93. If necessary, a recipe is read out from the storage unit 93 and executed in the process controller 91. Accordingly, a desired process is performed in the substrate processing system 1 under the control of the process controller 91.

In the substrate processing system 1 having the above-described configuration, wafers W, each having a silicon oxide film as a target of the oxide film removal process in the etching apparatus 5, are accommodated in the carrier C and transferred to the substrate processing system 1. In the substrate processing system 1, an atmospheric side gate valve 16 is opened and a single wafer W is unloaded from the carrier C of the loader module 2 and loaded into the load-lock chamber 3 by any one of the transfer arms 11a and 11b of the first wafer transfer unit 11. The wafer W is transferred to the pick of the second wafer transfer unit 17 in the load-lock chamber 3.

Next, the atmospheric side gate valve 16 is closed and the load-lock chamber 3 is evacuated. Then, the gate valve 54 is opened and the wafer W is transferred to the etching apparatus 5 by stretching the pick to the etching apparatus 5.

Thereafter, the pick returns to the load-lock chamber 3 and the gate valve 54 is closed and the oxide film removal process is performed in the etching apparatus 5 as will be described below. Upon completion of the oxide film removal process, the gate valves 22 and 54 are opened and the wafer W that has been subjected to the oxide film removal process is transferred to the heat treatment apparatus 4 and mounted on the mounting stage provided in the heat treatment apparatus 4 by the pick of the second wafer transfer unit 17. Then, the wafer W mounted on the mounting stage is heated by the heater while introducing $N_2$ gas or the like into the chamber 20. Accordingly, the residue on the wafer W is removed by the heating.

Upon completion of the heat treatment in the heat treatment apparatus 4, the gate valve 22 is opened and the wafer W mounted on the mounting stage of the heat treatment apparatus 4 is transferred to the load-lock chamber 3 by the pick of the second wafer transfer unit 17. Then, the wafer is returned to the carrier C by one of the transfer arms 11a and 11b of the first wafer transfer unit 11. In this manner, the processing of a single wafer W is completed.

The substrate processing system 1 does not necessarily include the heat treatment apparatus 4. When the heat treatment apparatus 4 is not provided, the wafer W that has been subjected to the oxide film removal process may be transferred to the load-lock chamber 3 by the pick of the second wafer transfer unit 17 and then returned to the carrier C by any one of the transfer arms 11a and 11b of the first wafer transfer unit 11.

Hereinafter, a first embodiment of the oxide film removal process performed by the etching apparatus 5 (hereinafter, referred to as "first oxide film removal process") will be described. FIGS. 3A to 3J schematically show the first oxide film removal process for the wafer W. As can be seen from FIG. 3A, the wafer W has a structure in which a groove is formed in a predetermined pattern in a polysilicon film 201 formed on a surface of a silicon (Si) layer 200 as a base and a silicon oxide film ($SiO_2$) 202 is formed in the groove. Here, a process of completely removing the silicon oxide film 202 will be described.

The wafer W is manufactured by performing a process of forming the polysilicon film 201 on the surface of the Si layer 200, a process of forming a resist film in a predetermined pattern on the polysilicon film 201, a process of forming a groove by etching the polysilicon film 201 while using the resist film as an etching mask, a process of removing the resist film, a process of forming the silicon oxide film 202, and a CMP (Chemical Mechanical Polishing) process. Therefore, as can be seen from FIG. 3A, before the first oxide film removal process is performed, the silicon oxide film 202 and the polysilicon film 201 have the same height. The groove where the silicon oxide film 202 is formed serves as, e.g., an element isolation region of a memory device.

When the wafer W is mounted on the mounting stage 39 and the chamber 40 is airtightly sealed, argon gas is supplied from the argon gas supply unit 111 at a flow rate of, e.g., 200 sccm, and nitrogen gas is supplied from the nitrogen gas supply unit 108 at a flow rate of, e.g., 500 sccm to 1000 sccm. A pressure in the chamber 40 is decreased to and maintained at a predetermined vacuum level, e.g., 2000 mTorr (266.63 Pa), lower than an atmospheric pressure by the operation of the TMP 41. A temperature of the wafer W is maintained at a constant level between 90° C. and 120° C., e.g., at 120° C., by the temperature controller 36. Further, the temperature of the wafer W mounted on the mounting stage 39 is maintained at the constant level until the first oxide film removal process is completed.

Next, a reaction process (hereinafter, referred to as "COR process") in which a part of the surface of the silicon oxide film 202 is turned into a reaction by-product by reaction with an ammonia gas and a hydrogen fluoride gas is performed. In the COR process, first, an ammonia gas is supplied into the chamber 40 from the ammonia gas supply unit 107. The ammonia gas is supplied at a flow rate of, e.g., 80 sccm, for, e.g., 10 seconds. In addition, argon gas is supplied into the chamber 40 at a flow rate of, e.g., 140 sccm while stopping the supply of nitrogen gas. On the contrary, nitrogen gas may be supplied while stopping the supply of argon gas. Or, a gaseous mixture of nitrogen gas and argon gas may be supplied at a controlled flow rate. A pressure in the chamber 40 is controlled to, e.g., 900 mTorr, by controlling the operation of the TMP 41.

Next, a hydrogen fluoride gas is supplied into the chamber 40 from the hydrogen fluoride gas supply unit 115 at a flow rate of, e.g., 80 sccm, while continuously supplying the ammonia gas into the chamber 40 at a flow rate of, e.g., 80 sccm. The ammonia gas and the hydrogen fluoride gas are supplied for, e.g., 60 seconds. At this time, a pressure in the chamber 40 is controlled to, e.g., 2000 mTorr, by controlling the operation of the TMP 41.

Since the ammonia gas is already supplied into the chamber 40, when the hydrogen fluoride gas is supplied, an atmosphere in the chamber 40 becomes a mixture of the hydrogen fluoride gas and the ammonia gas. When the silicon oxide film 202 is exposed to such a gaseous mixture, reaction by-products such as ammonium hexafluorosilicate (($NH_4$)$_2SiF_6$), moisture and the like are generated by the following reaction schemes.

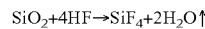

Figure 3A:
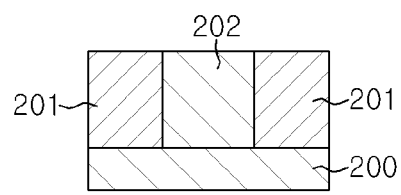
FIGS. 3A to 3J schematically show a first oxide film removal process for a semiconductor wafer by using the etching apparatus shown in FIG. 2.
Figure 3F:
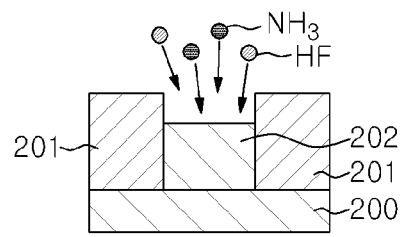
Figure 3B:
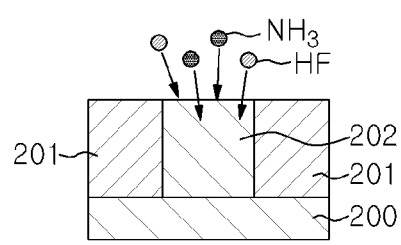
Figure 3G:
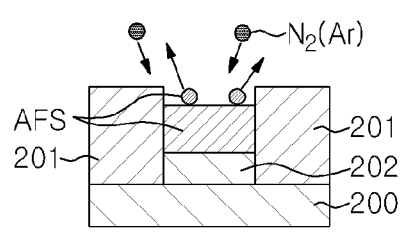
Figure 3C:
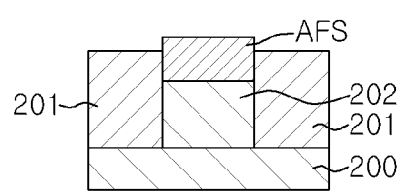
Figure 3H:
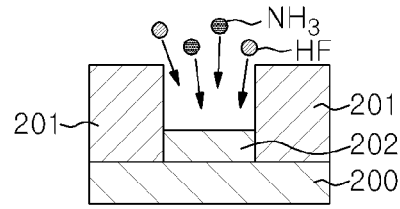

FIG. 3B schematically shows the COR process in which the silicon oxide film 202 deteriorates by the hydrogen fluoride gas and the ammonia gas by the above reaction schemes. FIG. 3C schematically shows a state in which ammonium hexafluorosilicate (indicated by "AFS" in FIGS. 3C, 3D, 3G, and 3I) that is a main reaction by-product is formed on the silicon oxide film 202. Moisture forming the reaction by-product is evaporated and discharged from the chamber 40 through the gas exhaust duct 62.

Next, a sublimation process of removing the reaction by-product (mainly ammonium hexafluorosilicate) generated in the COR process from the wafer W by sublimation is performed. In the PHT process, the supply of the hydrogen fluoride gas and the ammonia gas into the chamber 40 is stopped and argon gas or nitrogen gas is supplied into the chamber 40 at a flow rate of, e.g., 300 sccm. A pressure in the chamber 40 is controlled to, e.g., 300 mTorr, by controlling the operation of the TMP 41. A temperature of the wafer W is maintained at the same level as that in the COR process.

In the PHT process, the pressure in the chamber 40 is decreased to a level lower than that in the COR process (a vacuum level in the chamber 40 is increased to a level higher than that in the COR process), thereby promoting sublimation of the reaction by-product and discharge of the sublimated gas. Further, in the PHT process, an inert gas is supplied into the chamber 40 to diffuse the sublimated gas near the reaction by-product and decrease the concentration thereof. Accordingly, the sublimation speed of the reaction by-product is increased and the discharge of the sublimated gas is promoted. As a result, the processing time can be greatly reduced compared to, e.g., the case of performing the PHT process without supplying an inert gas (the case in which the chamber 40 is maintained at a predetermined depressurized state without supplying an inert gas into the chamber 40).

Figure 3D:
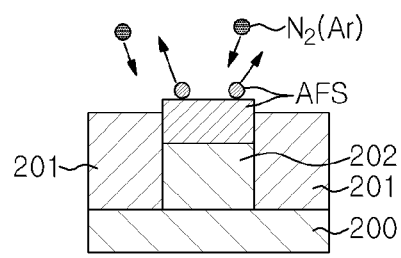
Figure 3I:
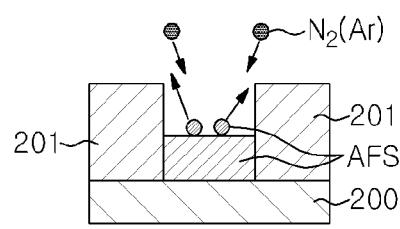
Figure 3E:
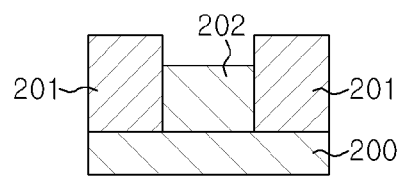

FIG. 3D schematically shows a state in which ammonium hexafluorosilicate that is a main reaction by-product is sublimated. The processing time of the PHT process varies depending on the amount of the reaction by-product generated in the COR process (the time length of the COR process). Therefore, the processing time of the PHT process is set to a minimum period that is enough to substantially completely remove the reaction by-product in accordance with the processing condition of the COR process. Specifically, the processing time of the COR process is set to 60 seconds, and the processing time of the PHT process is set to, e.g., 30 to 120 seconds.

After a first COR process and a first PHT process following the first COR process are completed (see FIG. 3E), the COR process and the PHT process are repeatedly performed until the silicon oxide film 202 has a predetermined thickness. FIGS. 3F to 3I schematically show a second COR process, a second PHT process, a third COR process, and a third PHT process, respectively. The COR process and the PHT process may be performed four or more times, if necessary, or may be performed only twice.

The processing conditions of the second and the third COR process are the same as those of the first COR process. The processing conditions of the second and the third PHT process are the same as those of the first PHT process. Therefore, the redundant description thereof will be omitted.

Figure 3J:
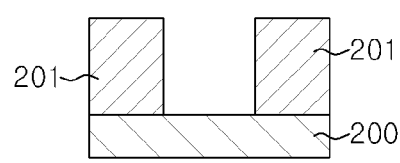

FIG. 3J schematically shows a state in which the silicon oxide film 202 is completely removed. The wafer W that has been subjected to the oxide film removal process is transferred to the heat treatment apparatus 4. In a state where the wafer W is heated to a predetermined temperature, ammonia gas and nitrogen gas (or argon gas) are supplied into the chamber 20 for a predetermined period of time (e.g., 5 seconds) to evaporate and remove the residue on the wafer W. The residue removal process may be performed after the final PHT process in the etching apparatus 5.

As described above, in the first oxide film removal process, a period of time required to remove the reaction by-product can be considerably reduced by combining the COR process of deteriorating a part of the surface of the silicon oxide film 202 by the hydrogen fluoride gas and the ammonia gas and the PHT process of sublimating the reaction by-product generated by the COR process while supplying the inert gas under a depressurized atmosphere. Further, the COR process and the PHT process are performed in the same chamber 40 without moving the wafer W and without changing the temperature of the wafer W. Accordingly, the entire processing time of the first oxide film removal process can be reduced and the throughput can be increased. As a result, the productivity can be improved.

Hereinafter, a second embodiment of the oxide film removal process performed by the etching apparatus 5 (hereinafter, referred to as "second oxide film removal process") will be described. In the first oxide film removal process, the time period during which the hydrogen fluoride gas and the ammonia gas in the COR process are simultaneously supplied is set to about 60 seconds. On the other hand, in the second oxide film removal process, the time period during which the hydrogen fluoride gas and the ammonia gas in the COR process are simultaneously supplied is set to, e.g., 2 to 10 seconds, and preferably 2 to 5 seconds.

In this regard, in a preceeding stage of the simultaneous supply of the hydrogen fluoride gas and the ammonia gas, the time period during which the ammonia gas and the inert gas are supplied into the chamber 40 is set to about 5 to 15 seconds. Since the amount of the reaction by-product generated in a single COR process is reduced, the processing time of the PHT process is set to be shorter than that in the first oxide film removal process. For example, the processing time of the PHT process is set to, e.g., 10 to 30 seconds.

In the second oxide film removal process, the COR process and the PHT process, of a shorter period, are repeated until the silicon oxide film 202 has a predetermined thickness. For example, in the case of performing a process of completely removing the silicon oxide film 202 shown in FIG. 3A, the number of executing the COR process and the PHT process in the second oxide film removal process becomes greater than that in the first oxide film removal process.

In the second oxide film removal process, it is required to uniformly distribute the hydrogen fluoride gas and the ammonia gas (particularly, the hydrogen fluoride gas) in the chamber 40 within a short supply time. Therefore, it is preferable to use, as the chamber 40, a chamber which has a small volume and in which a gas can be uniformly distributed.

The changes occurring in each of the COR process and the PHT process of a shorter period in the second oxide film removal process are the same as those in the COR process and the PHT process in the first oxide film removal process. In the COR process of a shorter period, the reactions shown in FIGS. 3B and 3C proceed. In the PHT process of a shorter period, the reactions shown in FIGS. 3D and 3E proceed. Since the reactions shown in FIGS. 3B to 3E have been already described, the redundant description thereof will be omitted.

In the second oxide film removal process in which the COR process and the PHT process of a shorter period are repeated, the PHT process of supplying an inert gas under a depressurized atmosphere is employed as in the first oxide film removal process. Therefore, a period of time required to remove the reaction by-product can be reduced and the throughput can be increased. As a result, the productivity can be improved.

In the COR process, from $SiO_z$ on the surface of the silicon oxide film 202, $SiO_2$ starts to react with a hydrogen fluoride gas and an ammonia gas. As a consequence, the hydrogen fluoride gas and the ammonia gas pass through the reaction by-product and then are diffused to a deep portion of the silicon oxide film 202. Therefore, the reaction gradually proceeds from the surface toward the deep portion of the silicon oxide film 202. Accordingly, in a single COR process, the generation speed of the reaction by-product is gradually decreased as the processing time elapses.

On the other hand, in the second oxide film removal process, rapid generation and sublimation of the reaction by-product near the surface of the silicon oxide film 202 are repeated without a period of time required for the hydrogen fluoride gas and the ammonia gas to diffuse to the deep portion of the silicon oxide film 202 after passing through the reaction by-product generated near the surface of the silicon oxide film 202. Accordingly, the processing efficiency can be increased and the throughput can be further improved.

One of the advantages of the second oxide film removal process is that the roughness (surface roughness) is improved. In other words, in a single COR process, a small amount of reaction by-product is generated on the surface of the silicon oxide film 202. Therefore, in the PHT process following the COR process, the reaction by-product can be substantially completely removed. Further, the processing time of the COR process is short, so that the damage to the polysilicon film 201 is small. With these effects, it is possible to improve the roughness on the wall surface of the polysilicon film 201 exposed by the second oxide film removal process.

Another advantage of the second oxide film removal process is that loading characteristics are improved. The loading characteristics indicate uniformity of the removal depth by the oxide film removal process (uniformity of the thickness of the remaining oxide film in the case of leaving the oxide film).

FIG. 3A shows only a single groove where the silicon oxide film 202 is formed. However, it is general that a plurality of grooves having different widths is formed in the polysilicon film 201 and the silicon oxide film 202 is formed in each of the grooves. Various gases are easily diffused with respect to a wide groove while being difficult to diffuse with respect to a narrow groove. Therefore, in the first oxide film removal process including the COR process of a longer period, the silicon oxide film formed in a wide groove is easily removed compared to the silicon oxide film formed in a narrow groove. Accordingly, the narrow groove and the wide groove may have different depths after the removal of the silicon oxide film.

On the other hand, in the second oxide film removal process, the COR process and the PHT process of a shorter period are repeated, so that the depth of the silicon oxide film removed by a single COR process and a single PHT process is hardly affected by the width of the groove. Accordingly, excellent loading characteristics can be obtained.

Still another advantage of the second oxide film removal process is that selectivity between an oxide film and a nitride film is increased. In the COR process using a gaseous mixture of a hydrogen fluoride gas and an ammonia gas, when the nitride film such as SiN or the like is exposed to a processing atmosphere, the gaseous mixture reacts with the nitride film as well as the silicon oxide film. Although the silicon oxide film rapidly reacts with the gaseous mixture, the nitride film having resistance to the gaseous mixture does not immediately react with the gaseous mixture. The nitride film reacts with the gaseous mixture after a few seconds after the contact with the gaseous mixture.

Therefore, in the second oxide film removal process, the hydrogen fluoride gas is supplied for, e.g., 2 to 5 seconds in the COR process and, then, the gaseous mixture is discharged from the chamber 40 in the PHT process following the COR process. Accordingly, the reaction between the gaseous mixture and the nitride film hardly occurs, which makes it possible to increase the selectivity between the oxide film and the nitride film.

Hereinafter, a third embodiment of the oxide film removal process performed by the etching apparatus 5 (hereinafter, referred to as "third oxide film removal process") will be described. In the third oxide film removal process, the in-plane uniformity of the oxide film removal process for the wafer W is improved by increasing the uniformity of distribution of the hydrogen fluoride gas in the chamber 40 in the second oxide film removal process. First, a timing chart of the second oxide film removal process will be described.

Figure 4A:
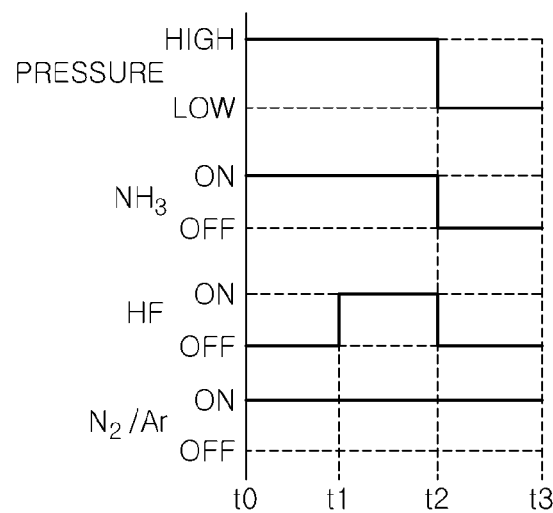
FIGS. 4A and 4B are a timing chart of a second oxide film removal process for the semiconductor wafer, which show an actual pressure change and gas supply/stop states.

FIG. 4A is the timing chart of the second oxide film removal process which is set and executed by the process controller 91. The state in which each of the ammonia gas, the hydrogen fluoride gas and the argon/nitrogen gas is supplied is indicated by "ON". The state in which each of the ammonia gas, the hydrogen fluoride gas and the argon/nitrogen gas is not supplied is indicated by "OFF". As long as the gas is supplied, the state in which a gas flow rate is changed is also indicated by "ON".

Referring to the timing chart of FIG. 4A, at time $t_0$, the COR process starts and ammonia gas and nitrogen gas (or argon gas) are supplied into the chamber 40. At time $t_1$, hydrogen fluoride gas is supplied into the chamber 40. At time $t_2$, the COR process is shifted to the PHT process, so that the supply of the hydrogen fluoride gas and the supply of the ammonia gas are stopped in a state where the supply of the nitrogen gas (or the argon gas) is continued, and the pressure in the chamber 40 is lowered. At time $t_3$, the PHT process is completed.

Figure 4B:
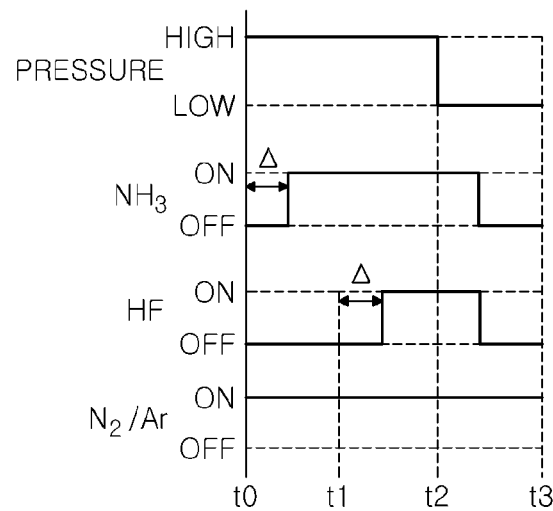

FIG. 4B is a chart showing an actual pressure change and gas supply/stop state in the chamber 40 in the case of realizing the timing chart of FIG. 4A. As described with reference to FIG. 2, an ammonia gas valve 106 for controlling supply/stop of ammonia gas is installed in a line that connects the ammonia gas supply unit 107 and the chamber 40 has a specific length from the ammonia gas valve 106 to the chamber 40. Similarly, a hydrogen fluoride gas valve 114 for controlling supply/stop of hydrogen fluoride gas is installed in a line that connects the hydrogen fluoride gas supply unit 115 and the chamber 40 and has a specific length from the hydrogen fluoride gas valve 114 to the chamber 40.

Therefore, even if the ammonia gas valve 106 is opened at the time $t_0$ and the hydrogen fluoride gas valve 114 is opened at the time $t_1$, there is actually a delay of time $\Delta$ until the ammonia gas and the hydrogen fluoride gas are supplied into the chamber 40, as can be seen from FIG. 4B. Here, for convenience of explanation, the delay of time of the ammonia gas and that of the hydrogen fluoride gas are set to the same period. In the case of stopping the gas supply, even if the ammonia gas valve 106 and the hydrogen fluoride gas valve 114 are closed at the time $t_2$, the ammonia gas and the hydrogen fluoride gas are supplied into the chamber 40 while the chamber 40 is depressurized.

In the second oxide film removal process, the supply time of the hydrogen fluoride gas into the chamber 40 is short. Therefore, if the depressurization of the chamber 40 is started before a predetermined amount of the hydrogen fluoride gas is supplied into the chamber 40, a predetermined amount of the hydrogen fluoride gas is discharged from the chamber 40 without reacting with the silicon oxide film 202. Therefore, the uniformity of the hydrogen fluoride gas in the chamber 40 is decreased, which may lead to the deterioration of the in-plane uniformity of the oxide film removal process for the wafer W. This problem becomes remarkable as the supply time of the hydrogen fluoride gas into the chamber 40 becomes shorter. For example, this problem is more remarkable when the supply time of the hydrogen fluoride gas into the chamber 40 is 2 seconds than 5 seconds.

In the second oxide film removal process, the ammonia gas supply time is longer than the hydrogen fluoride gas supply time, so that the supply delay of the ammonia gas is less problematic than that of the hydrogen fluoride gas. In the first oxide film removal process, the supply time of the hydrogen fluoride gas and the ammonia gas in the COR process is long, e.g., 60 seconds. Therefore, the delay of time $\Delta$ hardly causes a problem.

Therefore, in the third oxide film removal process, the timing of completing the supply of the hydrogen fluoride gas into the chamber 40 is made to coincide with the timing of decreasing the pressure in the chamber 40 to shift the COR process to the PHT process at least by controlling the timing of decreasing the pressure in the chamber 40 in accordance with the supply delay caused by the length of the line for the hydrogen fluoride gas.

Figure 5A:
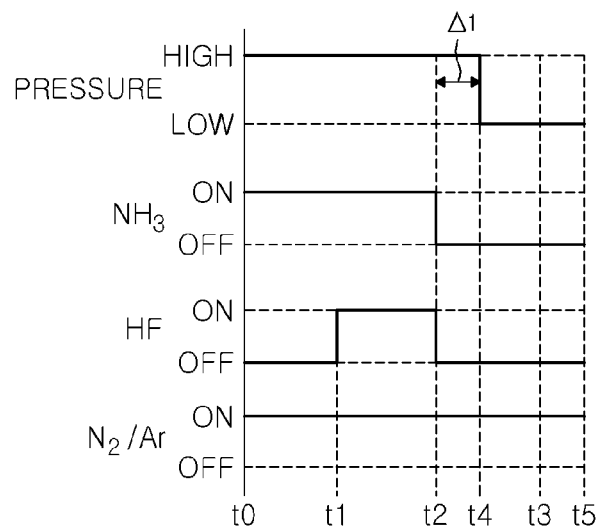
FIGS. 5A and 5B are a timing chart of a third oxide film removal process for the semiconductor wafer, which show an actual pressure change and gas supply/stop states.

FIG. 5A is a timing chart of a third oxide film removal process which is set and executed by the process controller 91. The timing chart of the ammonia gas, the hydrogen fluoride gas and the nitrogen gas (or argon gas) shown in FIG. 5A is the same as the timing chart shown in FIG. 4A. In the third oxide film removal process, at time $t_4$ later than the time $t_2$ by time $\Delta_1$ (here, $\Delta_1=\Delta$), the pressure in the chamber 40 is decreased to shift the COR process to the PHT process. Further, the processing time of the PHT process is ensured by extending the completion timing of the PHT process to time $t_5$ later than the time $t_3$ by time $\Delta_1$.

The time $\Delta_1$ depends on the length of the line from the hydrogen fluoride gas valve 114 to the chamber 40. However, it is preferable that the time $\Delta_1$ is equal to or slightly longer than the time $\Delta$, e.g., 1 second to 3 seconds, and preferably 2 seconds. If the time $\Delta_1$ is excessively long, the throughput is decreased, which is not preferable.

Figure 5B:
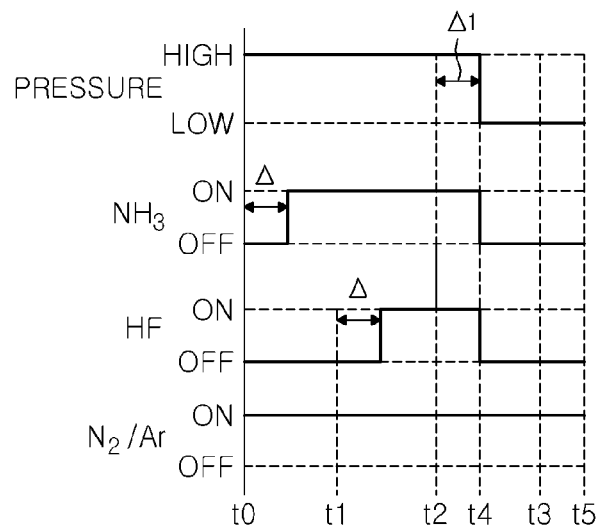

FIG. 5B is a chart showing an actual pressure change and a gas supply/stop state in the chamber 40 in the case of realizing the timing chart of FIG. 5A. The ON/OFF timings of the ammonia gas, the hydrogen fluoride gas and the nitrogen gas (or argon gas) in the chart of FIG. 5B are the same as those of the ammonia gas, the hydrogen fluoride gas and the nitrogen gas (or argon gas) in the chart of FIG. 4B. Meanwhile, the pressure in the chamber 40 can be decreased at the timing of completing the supply of the hydrogen fluoride gas into the chamber 40. Accordingly, a predetermined amount of the hydrogen fluoride gas is supplied into the chamber 40. As a result, the uniformity of the hydrogen fluoride gas in the chamber 40 can be improved and, further, the in-plane uniformity of the oxide film removal process for the wafer W can be improved.

Next, a fourth embodiment of the oxide film removal process executed by the etching apparatus 5 (hereinafter, referred to as "fourth oxide film removal process") will be described. In the second oxide film removal process, the hydrogen fluoride gas and the ammonia gas are simultaneously supplied in the COR process for, e.g., 2 to 10 seconds, and preferably for 2 to 5 seconds. On the other hand, in the fourth oxide film removal process, the hydrogen fluoride gas and the ammonia gas are simultaneously supplied in the COR process for a shorter period, and the simultaneous supply period is set such that the thickness of the etching target film (silicon oxide film 202) removed by a single COR process becomes about 3 nm or less.

Figure 6:
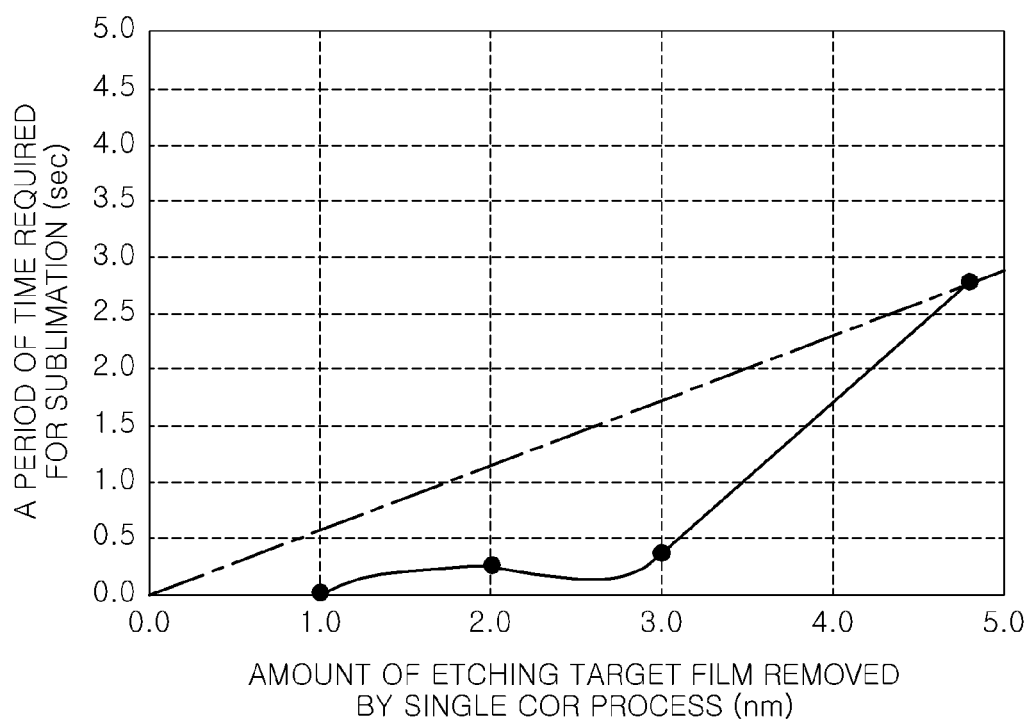
FIG. 6 is a graph showing relation between the amount of an etching target film removed by a single COR (Chemical Oxide Removal) process and a period of time required for sublimation of a reaction by-product generated at that time.

Prior to the present disclosure, the present inventors have found that when the amount of the etching target film removed by a single COR process is extremely decreased, a period of time required to sublimate the reaction by-product generated by the corresponding COR process becomes extremely short. Specifically, as shown in FIG. 6, when the thickness of the etching target film removed by a single COR process is about 3 nm or less, a period of time required to sublimate the reaction by-product is 0.5 second or less. When the thickness of the etching target film removed by a single COR process is about 1 nm or less, a period of time required to sublimate the reaction by-product is substantially 0 second (i.e., the generation and the sublimation of the reaction by-product occur almost at the same time). It is generally known that when a material becomes smaller than a specific size, its properties (physical properties) are changed. For example, a melting point of Au is generally 1064° C. However, a melting point of Au particle having a diameter of 2.4 nm is decreased to, e.g., about 100° C. The change of the physical properties by the size change is known as a size effect. This is because as a particle forming a material becomes smaller, a ratio of a surface area of an atom and a molecule in a single particle becomes larger and, thus, a portion which is affected by an external action or the like is increased. The present inventors have assumed that when the reaction by-product is a very small amount, the period of time required to sublimate the reaction by-product becomes considerably short because the sublimation of the reaction by-product is considerably promoted by the size effect. In the present embodiment, the period of time required to sublimate the reaction by-product is considerably shortened by utilizing the size effect.

FIGS. 7A to 7J schematically show a fourth oxide film removal process for a semiconductor wafer.

Figure 7A:
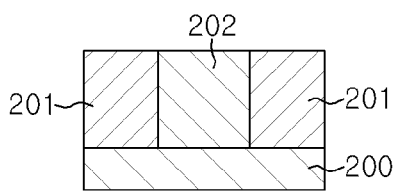
FIGS. 7A to 7J schematically show a fourth oxide film removal process for the semiconductor wafer by using the etching apparatus shown in FIG. 2.
Figure 7F:
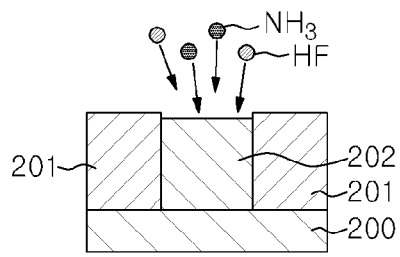
Figure 7B:
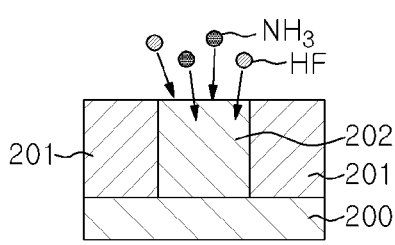
Figure 7G:
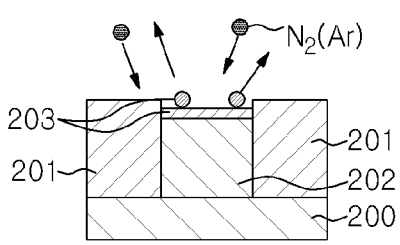
Figure 7C:
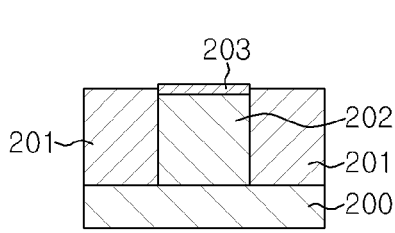
Figure 7H:
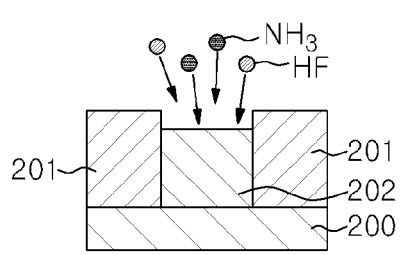
Figure 7D:
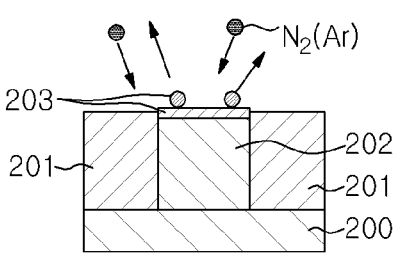
Figure 7I:
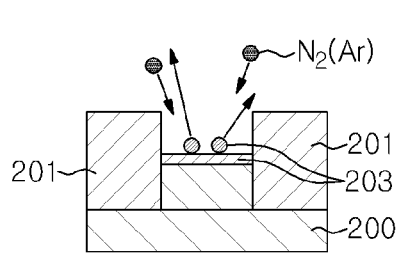
Figure 7E:
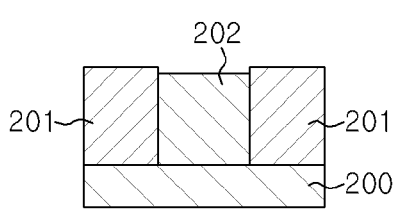

As shown in FIG. 7A, the wafer W has a structure in which a groove is formed in a predetermined pattern on a polysilicon film 201 formed on a surface of a silicon layer 200 serving as a base and a silicon oxide film 202 is formed in the groove, as in the case shown in FIGS. 3A to 3J. The silicon oxide film 202 and the polysilicon film 201 have the same height by the CMP process.

The wafer W is mounted on the mounting stage 39 and the chamber 40 is airtightly sealed. Then, argon gas and nitrogen gas are supplied into the chamber 40 from the nitrogen gas supply unit 108 and the argon gas supply unit 111, respectively. Further, a pressure in the chamber 40 is decreased to and maintained at a predetermined vacuum level lower than an atmospheric pressure, e.g., about 2000 mTorr, by the operation of the TMP 41. The temperature of the wafer W is maintained at a constant temperature in a range of about 90° C. to 120° C., e.g., about 120° C., by the temperature controller 36 until the fourth oxide film removal process is completed.

Next, the COR process is performed. In the COR process, first, ammonia gas is supplied from the ammonia gas supply unit 107 into the chamber 40. A flow rate of the ammonia gas is set to, e.g., about 80 sccm. At this time, the supply of nitrogen gas may be stopped while supplying argon gas. On the contrary, the supply of argon gas may be stopped while supplying nitrogen gas. A flow rate of a gaseous mixture of nitrogen gas and argon gas may be changed.

Next, hydrogen fluoride gas is supplied at a flow rate of, e.g., about 80 sccm, into the chamber 40 from the hydrogen fluoride gas supply unit 115 while continuously supplying the ammonia gas into the chamber 40. At this time, an atmosphere in the chamber 40 becomes a gaseous mixture of hydrogen fluoride gas and ammonia gas (see FIG. 7B), and a reaction by-product such as AFS, moisture or the like is generated by the exposure of the silicon oxide film 202 to the gaseous mixture (see FIG. 7C). In the fourth oxide film removal process, the supply time of the ammonia gas and the hydrogen fluoride gas is set such that the thickness of the silicon oxide film 202 removed by a single COR process becomes about 3 nm or less. A pressure in the chamber 40 is controlled to, e.g., about 2000 mTorr, by controlling the operation of the TMP 41.

Next, the PHT process is performed. In the PHT process, the supply of the hydrogen fluoride gas and the supply of the ammonia gas into the chamber 40 are stopped and, at the same time, argon gas or nitrogen gas is supplied at a flow rate of, e.g., 300 sccm. When the generation of the reaction by-product 203 is stopped by stopping the supply of the ammonia gas, the generated reaction by-product 203 is sublimated (see FIG. 7D). In the fourth oxide film removal process, the thickness of the silicon oxide film 202 removed by a single COR process is about 3 nm or less, which is very small. Therefore, the sublimation of the reaction by-product 203 is rapidly promoted by the size effect. Accordingly, unlike in the first oxide film removal process, it is not required to lower a pressure in the chamber 40 than that in the COR process in order to promote the sublimation of the reaction by-product. Thus, in the PHT process, the pressure in the chamber 40 is set to, e.g., 2000 mTorr, which is the same as that in the COR process, by controlling the operation of the TMP 41. Since a very small amount of the reaction by-product 203 is quickly sublimated, time required for the sublimation is extremely short. For example, when the thickness of the silicon oxide film 202 removed by a single COR process is about 1 nm or less, the time required for the sublimation is substantially 0 second as described above. The execution time of the PHT process in the fourth oxide film removal process is set to be extremely shorter than that of the PHT process in the first oxide film removal process. Further, the temperature of the wafer W in the PHT process is maintained at the same level as that in the COR process.

Upon completion of the first COR process and the first PHT process following the first COR process (see FIG. 7E), the COR process and the PHT process are repeated until the silicon oxide film 202 has a predetermined thickness. FIGS. 7F to 7I schematically show a second COR process, a second PHT process, a third COR process, and a third PHT process, respectively. The COR process and the PHT process may be executed four or more times, if necessary, or may be executed only twice. The processing conditions of the second and subsequent COR process are the same as those of the first COR process. The processing conditions of the second and subsequent PHT process are the same as those of the first PHT process. Therefore, the redundant description thereof will be omitted.

Figure 7J:
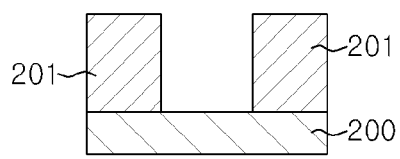

FIG. 7J schematically shows a state in which the silicon oxide film 202 is completely removed. As in the first oxide film removal process, the wafer W from which the silicon oxide film 202 is removed is transferred to the heat treatment apparatus 4. Then, the wafer W is heated to a predetermined temperature, and nitrogen gas is supplied into the chamber 20 for a predetermined period of time to remove a residue remaining on the wafer W by sublimation.

Figure 8:
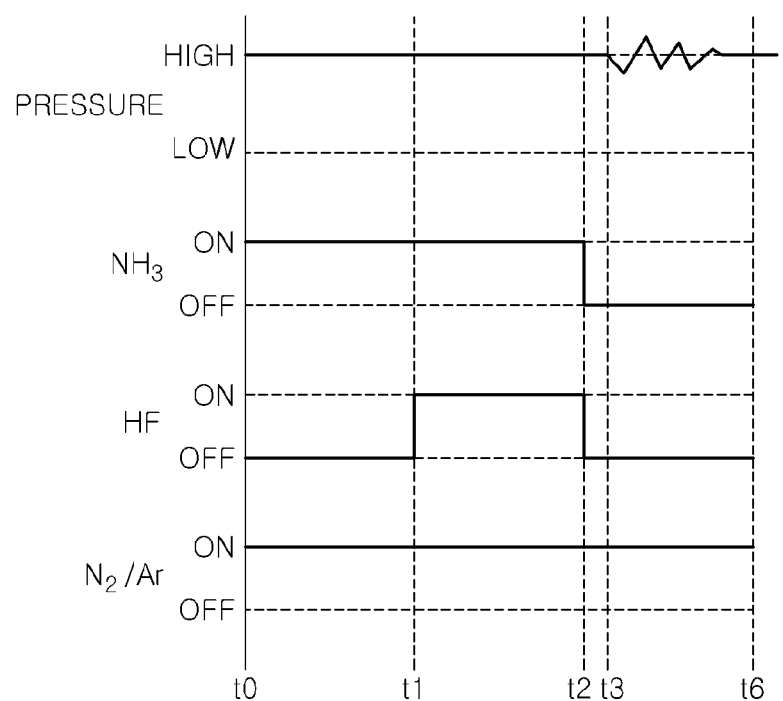
FIG. 8 is a timing chart of the fourth oxide film removal process for the semiconductor wafer.

FIG. 8 is a timing chart of the fourth oxide film removal process set and executed by the process controller 91. Similarly to FIG. 4A, the state in which each of the ammonia gas, the hydrogen fluoride gas and the argon/nitrogen gas is supplied is indicated by "ON". The state in which each of the ammonia gas, the hydrogen fluoride gas and the argon/nitrogen gas is not supplied is indicated by "OFF". As long as the gas is supplied, the state in which a gas flow rate is changed is also indicated by "ON". The term "pressure" indicates a pressure in the chamber 40.

Referring to the timing chart of FIG. 8, at time $t_0$, the COR process starts and ammonia gas and nitrogen gas (or argon gas) are supplied into the chamber 40. At time $t_1$, hydrogen fluoride gas is supplied into the chamber 40. At time $t_2$, the supply of the hydrogen gas and the supply of the ammonia gas are stopped while continuing the supply of the nitrogen gas (or argon gas) in order to shift the COR process to the PHT process. At time $t_3$, the PHT process is completed. As described above, in the fourth oxide film removal process, the thickness of the silicon oxide film 202 removed by a single COR process is about 3 nm or less, which is very small. Further, the sublimation of the reaction by-product 203 rapidly proceeds by the size effect. Therefore, the time required for the sublimation is very short. Accordingly, the execution time of the PHT process, i.e., duration from time $t_2$ to time $t_3$, is very short. In the oxide film removal process, the pressure in the chamber 40 may be disturbed by the execution of the COR process and the PHT process. Thus, a pressure control process of controlling a pressure in the chamber 40 to a level suitable for the execution of the COR process, e.g., 2000 mTorr, may be executed between the PHT process and the next COR process by controlling the flow rates of the argon gas or the nitrogen gas and controlling the operation of the TMP 41 in a state where the supply of the hydrogen fluoride gas and the supply of the ammonia gas are stopped. Referring to FIG. 8, the pressure control process is performed from time $t_3$ to time $t_6$. In the pressure control process, the supply of the ammonia gas is stopped, so that a very small amount of reaction by-product 203 can be sublimated. Therefore, in the fourth oxide film removal process, even if the duration of time $t_2$ to time $t_3$ in which the PHT process is performed is substantially 0 second, a very small amount of the reaction by-product 203 can be sufficiently sublimated and removed in the subsequent pressure control process. In other words, in the fourth oxide film removal process, when the pressure control process is performed, the PHT process can be substantially omitted.

As described above, in the fourth oxide film removal process, the thickness of the silicon oxide film 202 removed by a single COR process is about 3 nm or less, so that the sublimation of the reaction by-product 203 can be rapidly promoted by the size effect. As a result, the execution time of the PHT process can be considerably shortened and the throughput can be further improved.

In the fourth oxide film removal process, the sublimation of the reaction by-product 203 is rapidly promoted by the size effect, so that it is not required to lower the pressure in the chamber 40 than that in the COR process in order to promote the sublimation of the reaction by-product 203. In other words, when the COR process is shifted to the PHT process, the control of decreasing the pressure in the chamber 40 is not required. Accordingly, the throughput can be further improved.

In the fourth oxide film removal process, when the COR process and the PHT process are repeated, the pressure control process is performed between the PHT process and the next COR process. Therefore, a very small amount of the reaction by-product 203 can be sufficiently sublimated and removed in the pressure control process. As a result, the PHT process can be substantially omitted, which leads to further improvement of the throughput.

While the embodiments of the disclosure have been described, the disclosure is not limited to the above-described embodiments. For example, a target of the oxide film removal process is not limited to a silicon oxide film and may also be a natural oxide film, a BPSG film, or various silicon oxide films such a HDP-SiO$_2$ film and the like. Further, the disclosure is not limited to the COR process and may also be applied to a process of removing a SiN film from a surface of a substrate by supplying a gaseous mixture of a halogen element-containing gas and a basic gas into the processing chamber. Moreover, although nitrogen gas and argon gas are used as an inert gas in the above-described embodiments, any one of the nitrogen gas and the argon gas may be used as the inert gas, or other inert gases such as a helium gas, a xenon gas and the like may be used separately or as a mixture.

The object of the disclosure can also be realized by supplying a storage medium in which program codes of software that realize the functions of the above-described embodiments are stored to the process controller 91, and causing the process controller 91 to read out and execute the program codes stored in the storage medium.

In this case, the program codes themselves read out from the storage medium realize the functions of the above-described embodiments and, thus, the program codes and the storage medium in which the program codes are stored constitute the disclosure.

While the disclosure has been shown and described with respect to the embodiments, it will be understood by those skilled in the art that various changes and modifications may be made without departing from the scope of the disclosure as defined in the following claims.

What is claimed is:

1. A substrate processing method for removing an oxide film formed on a surface of a substrate, comprising:
    (a) transforming the oxide film into a reaction by-product by supplying a hydrogen fluoride gas and a basic gas to the substrate accommodated in a processing chamber; and
    (b) sublimating the reaction by-product to remove the reaction by product from the substrate by stopping the supply of the hydrogen fluoride gas into the processing chamber and supplying an inert gas into the processing chamber,
    wherein the step (a) and the step (b) are repeated a plurality of times,
    wherein, when a thickness of the oxide film removed by one cycle of the step (a) is about 1 nm or less, a duration of the step (b) is controlled to cause generation and sublimation of the reaction by-product to occur substantially at the same time, and
    wherein the hydrogen fluoride gas is supplied for 2 to 5 seconds in the step (a) so that selectivity between the oxide film and a nitride film formed on the surface of the substrate is increased.

2. The substrate processing method of claim 1, wherein in the step (b), the supply of the basic gas into the processing chamber is stopped.

3. The substrate processing method of claim 1, wherein the oxide film is a $SiO_2$ film, the basic gas is ammonia gas, and the inert gas is nitrogen gas or argon gas.

4. The substrate processing method of claim 1, wherein a temperature of the substrate in the step (a) is set to the same temperature as that of the substrate in the step (b).

5. The substrate processing method of claim 4, wherein the temperature of the substrate is set in a range of 90° C. to 120° C.

6. The substrate processing method of claim 1, wherein a pressure in the processing chamber in the step (b) is set to the same pressure as that in the processing chamber in the step (a).

7. A substrate processing apparatus comprising: a mounting stage to mount thereon a substrate; a chamber to accommodate therein the mounting stage; a temperature control unit configured to control a temperature of the substrate mounted on the mounting stage; a gas supply unit configured to selectively supply a hydrogen fluoride gas, a basic gas and an inert gas into the chamber; a gas exhaust unit configured to exhaust the chamber; and a control unit configured to control operations of the temperature control unit, the gas supply unit and the gas exhaust unit, wherein the control unit is configured to repeatedly perform a plurality of times a step (a) of transforming an oxide film into a reaction by product by supplying the hydrogen fluoride gas and the basic gas to the substrate; and a step (b) of sublimating the reaction byproduct to remove the reaction by-product from the substrate by stopping the supply of the hydrogen fluoride gas into the processing chamber and supplying an inert gas into the processing chamber wherein, when a thickness of the oxide film removed by one cycle of the step (a) is about 1 nm or less, a duration of the step (b) is controlled to cause generation and sublimation of the reaction by-product to occur substantially at the same time, and wherein the control unit is configured to supply the hydrogen fluoride gas for 2 to 5 seconds in the step (a) so that selectivity between the oxide film and a nitride film formed on the surface of the substrate is increased.

* * * * *